(12) United States Patent
Dunn et al.

(10) Patent No.: US 8,375,539 B2
(45) Date of Patent: Feb. 19, 2013

(54) METHOD OF MANUFACTURING COMPLIMENTARY METAL-INSULATOR-METAL (MIM) CAPACITORS

(75) Inventors: James Stuart Dunn, Jericho, VT (US); Zhong-Xiang He, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 570 days.

(21) Appl. No.: 12/535,804

(22) Filed: Aug. 5, 2009

(65) Prior Publication Data

US 2011/0032660 A1 Feb. 10, 2011

(51) Int. Cl.
*H01G 7/00* (2006.01)

(52) U.S. Cl. ...... 29/25.42; 29/25.03; 29/25.41; 29/847; 438/240; 361/313

(58) Field of Classification Search ......... 29/830–832, 29/846–847, 25.42, 25.41; 257/296, 301–306, 257/E29.165; 438/3, 240, 250, 253
See application file for complete search history.

(56) References Cited

U.S. PATENT DOCUMENTS

| 3,894,872 | A | * | 7/1975 | Mitchell et al. | 216/6 |
| 6,430,028 | B1 | * | 8/2002 | Kar-Roy et al. | 361/306.3 |
| 6,677,254 | B2 | | 1/2004 | Narwankar et al. | |
| 6,730,573 | B1 | | 5/2004 | Ng et al. | |
| 6,774,425 | B2 | * | 8/2004 | Lachner et al. | 257/306 |
| 6,777,777 | B1 | * | 8/2004 | Kar-Roy et al. | 257/532 |
| 6,885,056 | B1 | | 4/2005 | Dornisch et al. | |
| 6,893,935 | B2 | * | 5/2005 | Lachner | 438/396 |
| 6,919,283 | B2 | | 7/2005 | Joshi | |
| 6,998,322 | B2 | | 2/2006 | Das et al. | |
| 7,008,841 | B2 | | 3/2006 | Kim et al. | |
| 7,118,985 | B2 | * | 10/2006 | Allman et al. | 438/396 |
| 7,312,118 | B2 | | 12/2007 | Kiyotoshi | |
| 7,823,260 | B2 | * | 11/2010 | Kim | 29/25.41 |
| 2005/0132549 | A1 | | 6/2005 | Shih et al. | |
| 2006/0158829 | A1 | | 7/2006 | Kwon et al. | |
| 2006/0286734 | A1 | | 12/2006 | Mussig et al. | |
| 2007/0202656 | A1 | | 8/2007 | Park et al. | |
| 2008/0020540 | A1 | | 1/2008 | Takeda et al. | |

* cited by examiner

*Primary Examiner* — Minh Trinh
(74) *Attorney, Agent, or Firm* — Anthony Canale; Roberts Mlotkowski Safran & Cole, P.C.

(57) ABSTRACT

A method of manufacturing a low capacitance density, high voltage MIM capacitor and the high density MIM capacitor. The method includes depositing a plurality of plates and a plurality of dielectric layers interleaved with one another. The method further includes etching a portion of an uppermost plate of the plurality of plates while protecting other portions of the uppermost plate. The protected other portions of the uppermost plate forms a top plate of a first metal-insulator-metal (MIM) capacitor and the etching exposes a top plate of a second MIM capacitor.

13 Claims, 4 Drawing Sheets

METHOD OF MANUFACTURING COMPLIMENTARY METAL-INSULATOR-METAL (MIM) CAPACITORS

FIELD OF THE INVENTION

The invention relates to complimentary metal-insulator-metal (MIM) capacitors and a method of manufacture and, more particularly, to a low capacitance density, high voltage MIM capacitor and the high density MIM capacitor formed simultaneously on a wafer and a method of manufacture.

BACKGROUND

Metal-insulator-metal (MIM) capacitors are valuable components in memory, logic and analog circuits. For example, MIM capacitors are critical in several mixed signal integrated circuits such as analog frequency tuning circuits, switched capacitor circuits, filters, resonators, up-conversion and down-conversion mixers, and A/D converters.

MIM capacitors are developed with the highest capacitance consistent with the operating voltage. For example, in older CMOS/SiGe generations, the maximum use voltage was 6.5V which has migrated to 5V and 3.3V for newer generations. However, as GaAs chip designs have been migrating into SiGe and RF-CMOS, the need for both high capacitance and high operating voltage MIM capacitors has arisen. As such, different types of MIM capacitors may be needed for different circuit requirements. As an example, low density (high voltage) capacitors are required for power amplifier applications and ADC/DAC converters; whereas, high density capacitors are required for RF filter/coupling and decoupling capacitors. High quality factor (Q) capacitors may also be needed for RF switching. For this reason, there is a need to have MIM capacitors to address different circuit design requirements. However, there is no known economical way to manufacture complimentary MIM capacitors on a single chip to address different circuit design requirements.

Accordingly, there exists a need in the art to overcome the deficiencies and limitations described hereinabove.

SUMMARY

In a first aspect of the invention, a method comprises depositing a plurality of plates and a plurality of dielectric layers interleaved with one another and an etching. The etching includes etching a portion of an uppermost plate of the plurality of plates while protecting other portions of the uppermost plate. The protected other portions of the uppermost plate forms a top plate of a first metal-insulator-metal (MIM) capacitor and the etching exposes a top plate of a second MIM capacitor.

In another aspect of the invention, a method of forming complimentary metal-insulator-metal (MIM) capacitors comprises forming a low capacitance density, high voltage MIM capacitor and a high density capacitor. The method further comprises: depositing a plurality of metal layers and dielectric layers in an interleaved pattern each at a same time and etching the plurality of metal layers and dielectric layers. The etching comprises: forming a bottom plate of the high density capacitor and the low capacitance density, high voltage MIM capacitor at a same time from a same plate of the plurality of metal layers; forming a top plate of the high density capacitor and a floating plate of the low capacitance density, high voltage MIM capacitor at a same time from a same plate of the plurality of metal layers; and forming a top plate of the low capacitance density, high voltage MIM capacitor from an uppermost of the plurality of metal layers.

In yet another aspect of the invention, a structure comprises a first metal-insulator-metal (MIM) capacitor comprising: a bottom metal plate, a floating metal plate; a top metal plate; and dielectric material disposed between the first metal plate, the floating metal plate and the top metal plate. The structure further comprises a second MIM capacitor comprising: a bottom metal plate which shares a same layer as the bottom metal plate of the first MIM capacitor and a common deposited metal layer; a top metal plate which shares a same level as the floating metal plate and a common deposited metal layer; and a same dielectric material of the dielectric material that is between the first metal plate and the floating metal plate of the first MIM capacitor.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to complimentary metal-insulator-metal (MIM) capacitors and a method of manufacture and, more particularly, to a low capacitance density, high voltage MIM capacitor and the high density MIM capacitor formed simultaneously on a wafer and a method of manufacture. In embodiments, the present invention comprises a plurality of MIM capacitors with a high quality factor, high voltage MIM capacitor having a middle floating plate. More specifically, the MIM capacitors are formed in the same via level which further includes a multi-level metal wiring with a metal wiring bottom plate embedded in a dielectric. A first MIM capacitor comprises a plurality of capacitor plates and a second MIM capacitor is formed between a bottom plate of the first MIM capacitor and a top surface of an underlying interconnect (e.g., Cu or AlCu wire). The method of forming the MIM capacitors comprises removing a top plate of the first MIM capacitor so that the bottom plate of the first MIM capacitor also functions as a top plate of the second MIM capacitor. Advantageously, the MIM capacitors of the present invention can be formed with Cu or Al BEOL (back end of line) processes.

Figure 1:
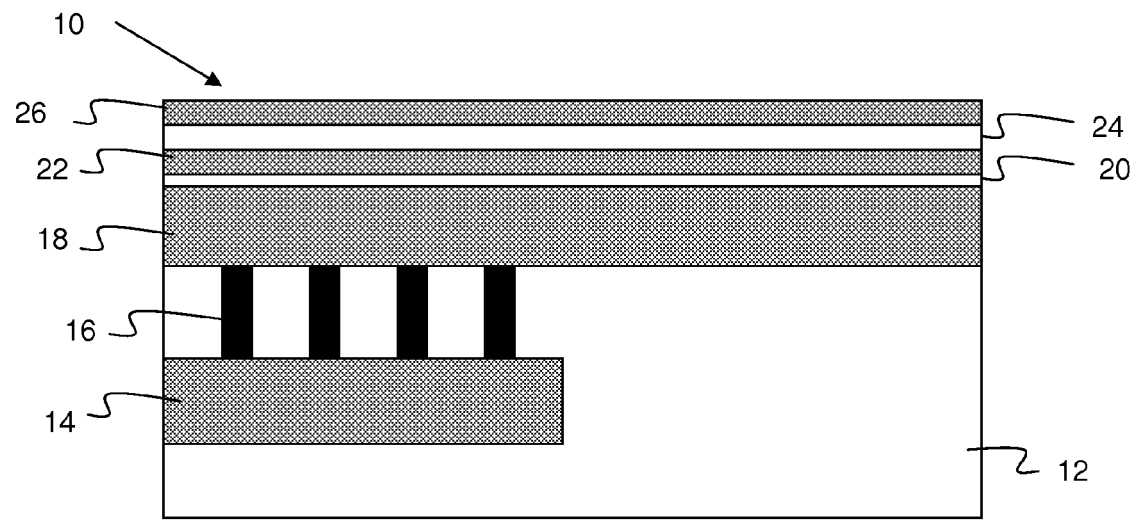
FIGS. 1-5 show structures and respective processing steps in accordance with aspects of the invention.

FIGS. 1-5 show structures and respective processing steps in accordance with aspects of the invention. Specifically, FIG. 1 shows a structure 10 comprising a bottom wire 14 formed in a dielectric layer 12 using conventional processes. In embodiments, the wire 14 is a copper or aluminum copper wire, for example, formed using conventional lithographic, etching and deposition processes such that no further explanation is required herein for those of skill in the art to understand the invention. The wire 14 may be two or more wiring layers, depending on the requirements of the device. The dielectric layer 12 can be any dielectric such as, for example, USG, FSG, SiCOH or a low-k dielectric.

Still referring to FIG. 1, contacts 16 are formed in the dielectric layer 12 using conventional lithographic, etching and deposition processes. In embodiments, for example, additional dielectric can be deposited over the wire 14, patterned and etched in order to deposit the contacts 16. In embodiments, the contacts 16 can be, for example, copper or tungsten; although other materials can also be used with the present invention. A bottom metal plate 18 is deposited to be in contact with the contacts 16. In embodiments, the metal plate 18 can be sputter deposited to a thickness of about 5000 Å. The metal plate 18 can be, for example, aluminum or tungsten; although other materials are also contemplated by the present invention. For example, the metal plate 18 can be a refractory metal such as, for example, TiN, or Tantalum or combinations such as, for example, TiN/W/TiN, TiN/AlCu/TiN or TaN/Ta/TiN.

A MIM dielectric layer 20 is deposited on the metal plate 18 using conventional processes such as, for example, CVD or PECVD processes. The deposition process, in embodiments, can deposit a high-k material such as, for example, SiN, $Ta_2O_5$, $ZrO_2$, $HfO_2$ or composite film such as $ZrO_2$/$Al_2O_3$/$ZrO_2$ to a thickness of about 300 Å; although other dimensions are also contemplated by the invention. A metal plate 22 is deposited on the dielectric layer 20 using conventional processes, e.g., sputtering. In embodiments, the metal plate 22 can be deposited to a thickness of about 1000 Å to 2000 Å; although other dimensions are also contemplated by the invention. The metal plate 22 may be made from a refractory metal such as, for example, TiN, Tungsten or Tantalum or combinations such as, for example, TiN/W/TiN, TiN/AlCu/TiN or TaN/Ta/TiN. The metal plate 22 can also be copper or aluminum.

A second MIM dielectric layer 24 is deposited on the metal plate 22. The second dielectric layer 24 can be formed using conventional deposition processes such as, for example, CVD or PECVD processes. The second dielectric layer 24 can be deposited to a thickness of about 1000 Å; although other dimensions are also contemplated by the invention. In embodiments, the second dielectric layer 24 is a low-k dielectric such as, for example, $SiO_2$, which may be used for a low capacitance density, high voltage MIM capacitor. In embodiments, it is also contemplated that the dielectric material may be the same for all plates, or thinner, or higher-k for one metal plate and thicker or lower-k for the other metal plate. In one specific example, the dielectric material can be $SiO_2$ deposited to a thickness of about 100 nm to achieve a 100V breakdown.

A metal plate 26 is deposited on the second dielectric layer 24 using conventional deposition processes such as, for example, sputtering techniques. The metal plate 26 can be deposited to a thickness of about 1000 Å to 2000 Å; although other dimensions are also contemplated by the invention.

Figure 2:
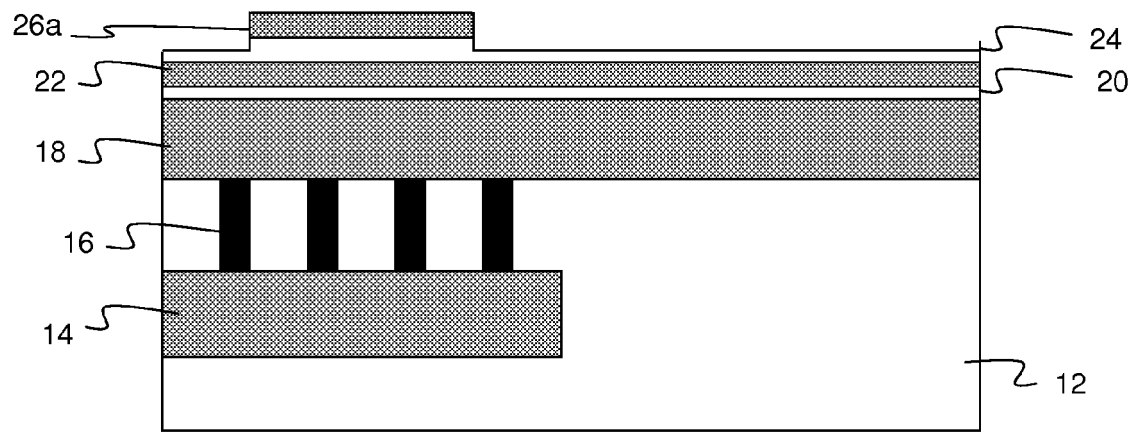

Referring to FIG. 2, the metal plate 26 is patterned using conventional processes. More specifically, using conventional lithographic and etching processes, portions of the metal plate 26 are etched to form MIM metal plate 26a. In this process, the portions that form the MIM metal plate 26a, are protected by a mask which, in subsequent processes, will form a portion of the low capacitance density, high voltage MIM capacitor. In this etching process, however, a portion of the metal plate is removed on a side of where a high density capacitor is to be formed in later processes. The etching process can also remove an upper layer of the second dielectric 24; however, such removal is only minimal.

Figure 3:
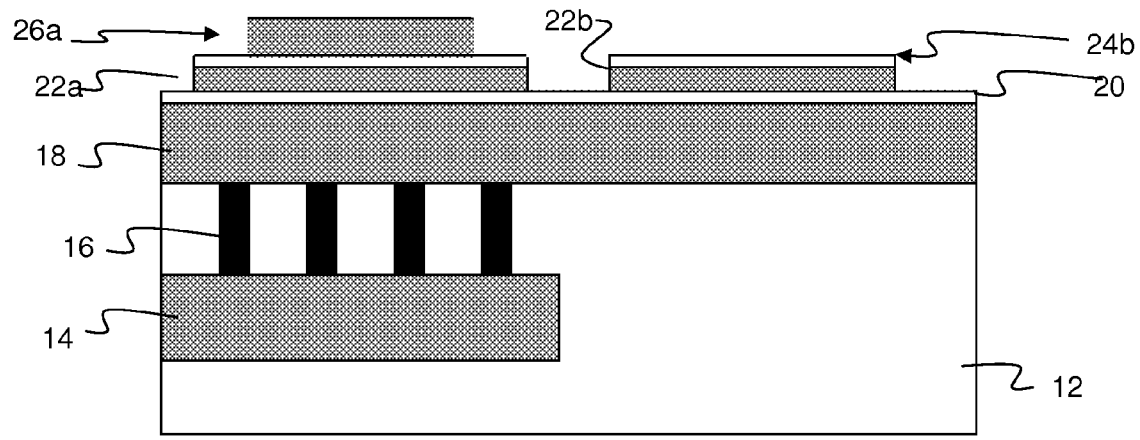

In FIG. 3, the structure of FIG. 2 is further patterned using conventional processes. More specifically, using conventional lithographic and etching processes, portions of the second dielectric 24 and metal plate 22 are etched to define MIM metal plate 24a and further define the MIM metal plate 22a. In embodiments, the etching will form separate metal plates 22a and 22b which are used to form part of the low capacitance density, high voltage MIM capacitor and high density capacitor, respectively. The etching will preferably stop at the dielectric layer 20.

Figure 4:
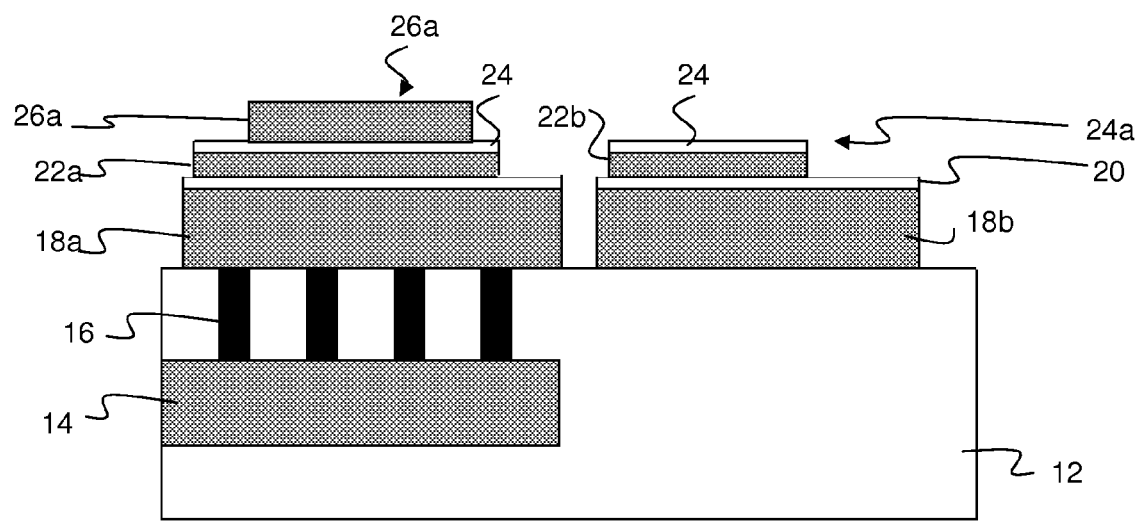

In FIG. 4, portions of the dielectric layer 20 and metal plate 18 are etched using conventional processes as described above. This etching process will form two distinct, separate metal plates 18a, 18b used for the low capacitance density, high voltage MIM capacitor and high density capacitor, respectively. In this etching process, the metal plate 26a, dielectric layer 24, metal plate 22a, dielectric layer 20 and a portion of the metal plate 18a will be protected by a mask. Similarly, the dielectric layer 24b, metal plate 22b, dielectric layer 20 and a portion of the metal plate 18b will be protected by a mask.

Figure 5:
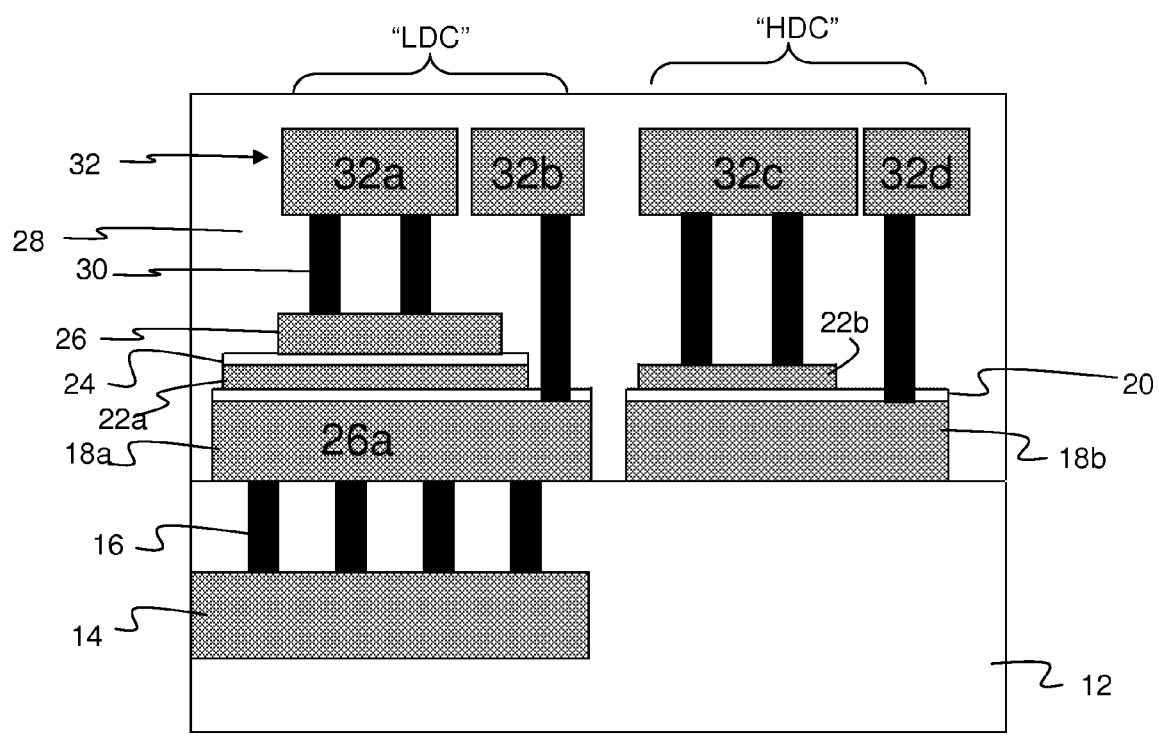

FIG. 5 shows the formation of the low capacitance density, high voltage MIM capacitor "LDC" and high density capacitor "HDC", respectively. More specifically, the dielectric layer 24 on the side of the "HDC" is removed, while protecting the "LDC". This removal process can be performed using conventional etching process such as, for example, RIE. The "LDC" can be protected during the etching process using a conventional mask.

Still referring to FIG. 5, a dielectric layer 28 (e.g., ILD) is deposited using a conventional deposition process. Contacts 30 and wires 32 are formed in the dielectric layer 28 using conventional dual damascene processes. The wires 32 may be metal such as, for example, copper or aluminum, etc. In embodiments, during the formation processes for the contacts, a portion of the dielectric layer 20 over the metal plate 18a is removed so that one contact can contact the metal plate 18a. More specifically, on the side of the "LDC", two contacts 30 are deposited in contact with the metal plate 26 on the island 26a and metal wire 32a, as well one contact is deposited in contact with the bottom metal plate 18a and the metal wire 32b. The metal plate 22a on the side of the "LDC" will be a floating middle plate. On the side of the "HDC", two contacts 30 are deposited in contact with the metal plate 22b and metal wire 32c on the island 24a, as well as one contact deposited in contact with the bottom metal plate 18b and the metal wire 32d.

In this way, in embodiments, the "LDC" will be comprised of, amongst other layers shown in FIG. 5, the low-k dielectric layer; whereas, the "HDC", on the other hand, will be comprised of, amongst other layers shown in FIG. 5, the high-k dielectric layer. In embodiments, the "LDC" can also include the high-k dielectric layer. As thus described, the MIM capacitor "LDC" comprises a plurality of capacitor plates and the MIM capacitor "HDC" is formed from bottom plate that also forms the MIM capacitor "LDC" and a top surface of an underlying interconnect (e.g., Cu or AlCu wire 32). Also, the method of forming the MIM capacitors comprises removing a top plate of the MIM capacitor "LDC" so that the bottom metal plate that is used for the MIM capacitor "LDC" also functions as a top plate of the MIM capacitor "HDC". Thus, in accordance with the invention, a three metal plate MIM wired in a series configuration with a floating middle plate for high voltage application is provided.

Figure 6:
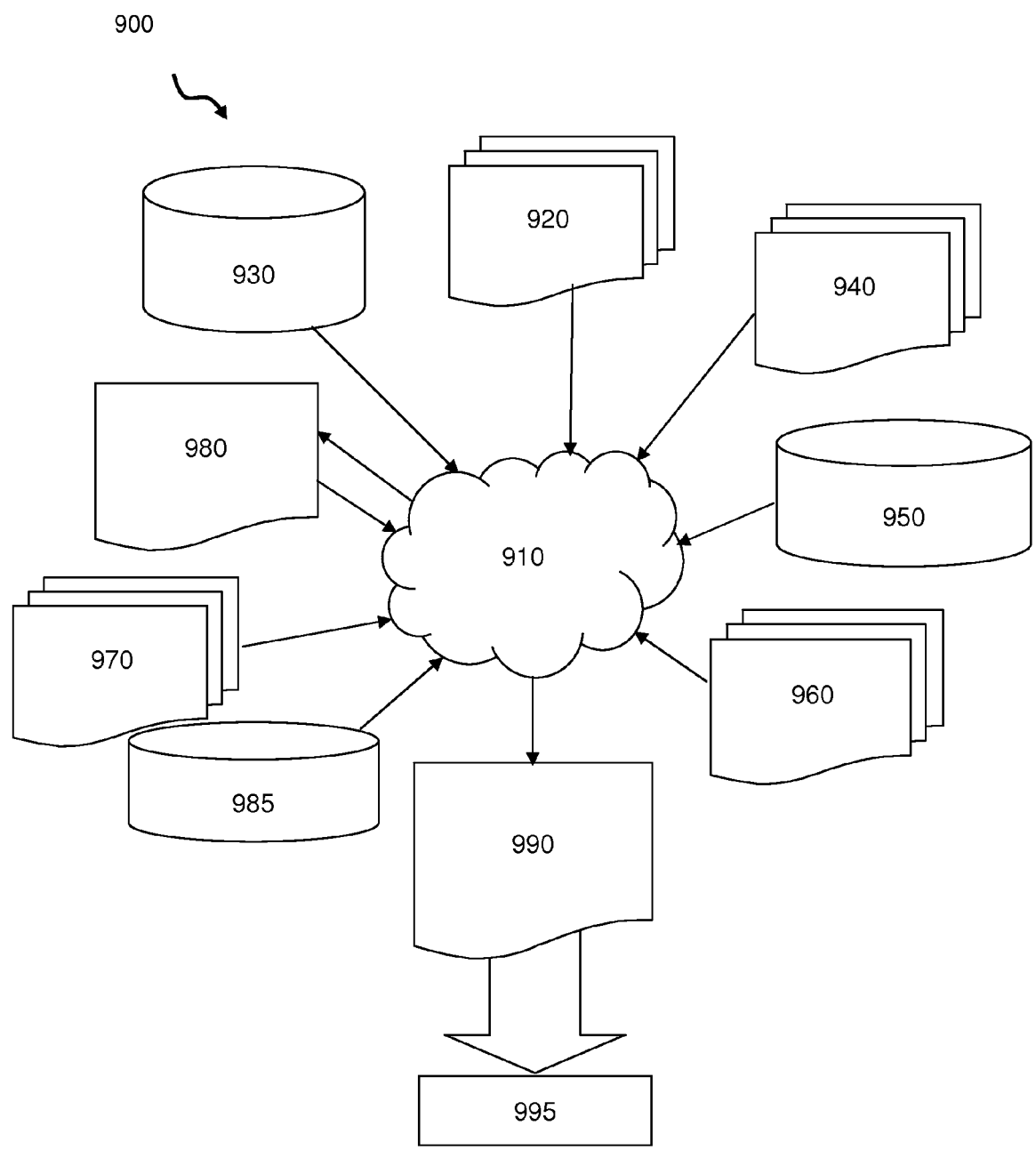
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5, for example. In one embodiment, design structure 990 may comprise a compiled, executable HDL simulation model that functionally simulates the devices shown in FIGS. 1-5, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming complimentary metal-insulator-metal (MIM) capacitors comprising forming a low capacitance density, high voltage MIM capacitor and a high density capacitor comprising:
   depositing a plurality of plates and a plurality of dielectric layers interleaved with one another; and
   etching a portion of an uppermost plate of the plurality of plates while protecting other portions of the uppermost plate, wherein the protected other portions of the uppermost plate forms a top plate of a first metal-insulator-metal (MIM) capacitor and the etching exposes a top plate of a second MIM capacitor, wherein:
   the depositing a plurality of plates interleaved with a plurality of dielectric layers comprises depositing a first metal plate, a first dielectric layer, a second metal plate, a second dielectric layer and a third metal plate;
   the first metal plate forms a bottom metal plate of the first MIM capacitor and the second MIM capacitor, simultaneously;
   the second metal plate forms a floating middle metal plate of the first MIM capacitor and the top plate of the second MIM capacitor, simultaneously; and
   the third metal plate is the uppermost plate that forms the top plate of the first MIM capacitor.

2. The method of claim 1, wherein the uppermost plate that forms the top plate of the second MIM capacitor is a floating plate for the first MIM capacitor.

3. The method of claim 2, wherein the floating plate for the first MIM capacitor is a middle floating plate.

4. The method of claim 1, further comprising etching a portion of a bottommost plate of the plurality of plates in order to form two bottom plates and separate the first MIM capacitor and the second MIM capacitor, wherein a first of the two bottom plates forms a bottom metal plate of the first MIM capacitor and a second of the two bottom plates forms a bottom metal plate of the second MIM capacitor, simultaneously.

5. The method of claim 1, wherein the first metal plate is etched to separate the first MIM capacitor from the second MIM capacitor.

6. The method of claim 1, wherein the first MIM capacitor is a low capacitance density, high voltage MIM capacitor and the second MIM capacitor is a high density capacitor.

7. The method of claim 1, further comprising:
   connecting the first MIM capacitor to a bottom wire and at least one top wire; and
   connecting the second MIM capacitor to at least one top wire,
   wherein the at least one wire connected to the first MIM capacitor and the second MIM capacitor are formed on a same wiring level and connected to both the top plate and a bottom plate of the first MIM capacitor and the second MIM capacitor.

8. A method of forming complimentary metal-insulator-metal (MIM) capacitors comprising forming a first MIM capacitor and a second MIM capacitor, comprising:
   depositing a plurality of plates and a plurality of dielectric layers interleaved with one another; and
   etching a portion of an uppermost plate of the plurality of plates while protecting other portions of the uppermost plate, wherein the protected other portions of the uppermost plate forms a top plate of a first metal-insulator-metal (MIM) capacitor and the etching exposes a top plate of a second MIM capacitor, wherein, through etching processes, a bottom plate of the plurality of plates forms, simultaneously, a bottom plate of both the first MIM capacitor and the second MIM capacitor on a same level, a middle plate of the plurality of plates form, simultaneously, a floating gate of the first MIM capacitor and the top plate of the second MIM capacitor on a same level, and the uppermost plate of the plurality of plates forms the top plate of the first MIM capacitor at a higher level.

9. The method of claim 8, wherein the depositing comprises depositing a high-k dielectric material between two metal plates and a low-k dielectric material between two metal plates, wherein the high-k dielectric is between a bottom and middle plate of the plurality of plates which form the second MIM capacitor, the second MIM capacitor being a high density capacitor.

10. A method of forming complimentary metal-insulator-metal (MIM) capacitors comprising forming a low capacitance density, high voltage MIM capacitor and a high density capacitor by:
   depositing a plurality of metal layers and dielectric layers in an interleaved pattern each at a same time; and
   etching the plurality of metal layers and dielectric layers, wherein the etching comprises:
      forming a bottom plate of the high density capacitor and the low capacitance density, high voltage MIM capacitor at a same time from a same plate of the plurality of metal layers;
      forming a top plate of the high density capacitor and a floating plate of the low capacitance density, high voltage MIM capacitor at a same time from a same plate of the plurality of metal layers; and
      forming a top plate of the low capacitance density, high voltage MIM capacitor from an uppermost of the plurality of metal layers, wherein:
   the depositing a plurality of metal layers and dielectric layers in an interleaved pattern each at a same time comprises depositing a first metal plate, a first dielectric layer, a second metal plate, a second dielectric layer and a third metal plate;
   the first metal plate forms the bottom plate of the low capacitance density, high voltage MIM capacitor and the high density capacitor, simultaneously;
   the second metal plate forms the floating plate of the low capacitance density, and the top plate of the high voltage MIM capacitor, simultaneously; and
   the third metal plate forms the top plate of the low capacitance density, high voltage MIM capacitor.

11. The method of claim 10, wherein the first metal plate is etched to separate the low capacitance density, high voltage MIM capacitor from the high density capacitor.

12. The method of claim 10, wherein the depositing comprises depositing a high-k dielectric material between the first metal plate and the second metal plate and a low-k dielectric material between second metal plate and the third metal plate, wherein the high-k dielectric forms the high density capacitor.

13. A method of forming complimentary metal-insulator-metal (MIM) capacitors comprising forming a low capacitance density, high voltage MIM capacitor and a high density capacitor by:
   depositing a plurality of metal layers and dielectric layers in an interleaved pattern each at a same time; and
   etching the plurality of metal layers and dielectric layers, wherein the etching comprises:
      forming a bottom plate of the high density capacitor and the low capacitance density, high voltage MIM capacitor at a same time from a same plate of the plurality of metal layers;
      forming a top plate of the high density capacitor and a floating plate of the low capacitance density, high voltage MIM capacitor at a same time from a same plate of the plurality of metal layers; and
      forming a top plate of the low capacitance density, high voltage MIM capacitor from an uppermost of the plurality of metal layers;
   connecting the low capacitance density, high voltage MIM capacitor to a bottom wire and at least one top wire; and
   connecting the high density capacitor to at least one top wire, wherein
      the at least one wire connected to low capacitance density, high voltage MIM capacitor and the high density MIM capacitor are formed on a same wiring level and connected to both the top plate and bottom plate thereof, and
      the bottom wire is embedded in a dielectric layer below the bottom plate.

* * * * *